United States Patent

[11] 3,615,464

[72] Inventors Benjamin Agusta
Burlington;
Ravinder J. Sahni, Essex Junction, both of Vt.

[21] Appl. No. 777,013
[22] Filed Nov. 19, 1968
[45] Patented Oct. 26, 1971
[73] Assignee International Business Machines Corporation
Armonk, N.Y.

[54] PROCESS OF PRODUCING AN ARRAY OF INTEGRATED CIRCUITS ON SEMICONDUCTOR SUBSTRATE
7 Claims, 3 Drawing Figs.

[52] U.S. Cl. .......... 96/36.2, 96/44, 117/5.5, 117/212, 29/574, 29/576, 29/577, 34/173 R
[51] Int. Cl. .......... G03c 5/04
[50] Field of Search .......... 96/36.2, 74; 117/212; 29/574, 576 J, 577

[56] References Cited
UNITED STATES PATENTS

| | | | |
|---|---|---|---|
| 3,245,794 | 4/1966 | Conley .......... | 96/36.2 |
| 3,317,320 | 5/1967 | Reber .......... | 96/36.2 |
| 3,385,702 | 5/1968 | Koehler .......... | 96/44 |
| 3,508,209 | 4/1970 | Agusta et al. .......... | 340/173 |

*Primary Examiner*—Murray Katz
*Attorneys*—Hanifin and Clark and Willis E. Higgins

ABSTRACT: The relative number of masks required in different levels in a mask matching process used for different processing steps to expose photoresist in arrays of patterns for semiconductor circuits on a wafer may be determined on the basis of the average number of random defects in the mask levels. This provides a way to decrease the number of comparisons that need to e made in a mask matching process without lowering the increased yield of defect-free patterns on the substrate obtained through mask matching.

INVENTORS
BENJAMIN AGUSTA
RAVINDER J. SAHNI
BY Willis E. Higgins
ATTORNEY

PROCESS OF PRODUCING AN ARRAY OF INTEGRATED CIRCUITS ON SEMICONDUCTOR SUBSTRATE

FIELD OF THE INVENTION

This invention relates to processes for overlaying random defects in a plurality of masks used for different process steps in the manufacture of integrated circuits and other arrays of patterns on a substrate. Such processes are hereinafter referred to as mask matching processes. More particularly, the invention relates to a simplified mask matching process.

CROSS REFERENCE TO RELATED APPLICATIONS

This application covers an improvement in the processes disclosed and claimed in the copending and commonly assigned application of Arthur H. DePuy Ser. No. 777,011, and the copending and commonly assigned application of William N. Kuschel, Ser. No. 777,012, both filed on the same day as the present application.

DESCRIPTION OF THE PRIOR ART

Processes for producing an array of patterns, such as integrated circuits, on a substrate, such as a semiconductor wafer, using a plurality of masks having an array of patterns in a series of processing steps, are well known. Agusta et al. application Ser. No. 539,210, filed Mar. 31, 1966, entitled "-Monolithic Integrated Structure Including Fabrication and Package Therefor," now U.S. Pat. No. 3,508,209, assigned to the same assignee as the present application, discloses such a process. In such processes, a semiconductor wafer having an oxidized surface or other substrate is coated with photoresist, the photoresist is exposed through a mask having an array of patterns, the exposed photoresist is developed, and a pattern is etched to remove oxide in the wafer on those areas where the photoresist is not exposed. An impurity may then be diffused into the unoxidized semiconductor material exposed by the etching step. The process disclosed in the Agusta et al. application is used to produce an array of highly complex, closely spaced, integrated circuits on a semiconductor wafer.

In the production of such patterns on a substrate in this manner, defects in the masks are reproduced on the substrate. Such defects occur in a random fashion on the masks. These defects may be scratches on the masks, photoemulsion that was not removed in fabrication of the mask itself, areas of the mask where photoemulsion was removed where it should not have been removed, or other imperfections.

Even if most of the patterns in the array on each mask do not contain a defect, randomly occurring defects will produce defective patterns in most of the array if seven or eight masking steps are used to produce the array of patterns. For example, if 80 percent of the patterns in the array on each mask are defect free, randomly occurring defects on the patterns in the masks will reduce the maximum possible yield of patterns containing no defects obtained by using such masks in a process that requires eight different masking operations to about 17 percent. This yield figure assumes that no additional defects in the patterns will be produced by any other cause than defects in the masks. With an increased number of different masking steps, the maximum possible yield decreases exponentially. Semiconductor manufacturing processes involving, for example, 25 different masking steps therefore cannot be carried out on a practical basis unless something is done to reduce the number of defective integrated circuits produced by these randomly occurring mask defects.

U.S. Pat. No. 3,317,320, issued May 2, 1967, discloses one proposed solution for the problem of random mask defects. In the process there disclosed, two different masks having the same predetermined pattern are employed for each masking step required, either with or without the application of an additional layer of photoresist between the application of the two masks. While the array of predetermined patterns is the same on these two masks, the random distribution of defects is different.

This process reduces the effect of random mask defects, but it doubles the number of masking operations that must be carried out in a semiconductor manufacturing process which employs it. Additionally, the second mask having the same array of predetermined patterns must be registered very precisely in alignment with the image produced by the first mask.

Another proposed solution for the problem of random mask defects is touching up the masks themselves to correct them, as disclosed in commonly assigned U.S. Pat. No. 3,385,702 to Koehler, issued May 28, 1968. This approach, although very useful with some masks, is difficult to carry out when the patterns are very small and closely spaced, as in the case of present day monolithic integrated circuits on semiconductor wafers.

Another possible approach to the problem of random mask defects is to use higher quality masks. However, masks having even 20 percent of the integrated circuits in their arrays containing defects are very difficult to make, even with the very best mask fabrication technology. With the present state of mask fabrication technology, this approach is not practical.

A further problem in the prior art is the fact that a great deal of difficulty has been encountered in determining whether an apparent mask defect will in fact cause a defective integrated circuit at the array position containing the defect. Defective integrated circuits are often produced by mask defects which appear to be so slight as to cause no problem. Nondefective integrated circuits are at times produced at array positions containing apparently serious mask defects. Therefore, a manufacturing process which can maintain identification of mask locations in the array is needed. This information and the yield of nondefective integrated circuits from array locations containing possible defects in one or more of the masks would be very valuable in determining proper criteria for classifying particular circuit patterns on the masks as defective in fact. A related use of this information would be to determine whether defective circuits in an array are caused by mask defects or by the manufacturing process itself.

Thus, a serious problem exists in reducing the effect of randomly occurring mask defects on integrated circuit yields in processes requiring a plurality of masking steps. Further, a serious problem exists in the lack of ability to characterize accurately given integrated circuit patterns on masks as in fact defective.

SUMMARY OF THE INVENTION

These problems in the prior art may be overcome through the use of mask matching. The present invention simplifies mask matching processes of the type disclosed and claimed in the above mentioned DePuy application and Kuschel application. In the disclosed DePuy process, masks used for different process steps to expose photoresist in arrays of patterns for semiconductor circuits on a wafer are matched by combining one mask for each processing step in all possible combinations, then selecting the combination for use which will minimize the number of defective integrated circuits in the array. The Kuschel process improves the DePuy process by matching the masks sequentially. This is done by selecting a mask for one of the process steps, then choosing masks one step at a time for the remaining processing steps in the fabrication of an array of integrated circuits on a semiconductor wafer. The DePuy process enables a very marked improvement in semiconductor process yield to be obtained. The Kuschel process obtains virtually all of the benefit of the DePuy process but requires only a small fraction of the comparisons that must be made in the DePuy process.

In semiconductor manufacturing, some of the masks used for the different processing steps are much more difficult to fabricate than others. This is due to the fact that some of the levels have smaller and more complex patterns in the array than others. The difficulties involved may be appreciated by knowing that complex circuit patterns must be prepared in an area of about 0.06 inch by 0.06 inch or smaller. Because of the difficulties in making them, masks with smaller and more complex patterns have more random defects in them than masks for other levels. The average number of defects for the masks is different for essentially every level of mask, because the patterns are different.

The practice in the semiconductor manufacturing industry is to fabricate an equal number of the masks for each level. In this case, the maximum number of defect-free integrated circuits in an array that can be produced by matching the available masks for the different levels will be determined by the average number of defects in the masks. Since some mask levels contain more defects than others, it is not possible to obtain the same high yields with the same number of these masks as of masks for the other levels. More masks are therefore required for some levels than for others if high yields are to be obtained. The most difficult mask to fabricate has the highest average number of random defect. Therefore, the number of the most difficult mask to fabricate available will determine the maximum possible yield of defect-free devices obtainable in mask matching. Production of masks for the other levels beyond that necessary to give the same yield of defect-free integrated circuits represents wasted effort, both in the actual fabrication of the masks and in additional comparisons required in the mask matching process, due to the larger inventory of masks. A mask matching process in which the numbers of masks in each level that should be made for best results with the least amount of effort therefore would have substantial value.

Accordingly, it is an object of this invention to provide a method for determining the number of masks from different levels that should be fabricated for use in a mask matching process for making an array of patterns on a substrate with a high yield.

It is a further object of the invention to provide a method for decreasing the number of comparisons that need to be made in a mask matching process by eliminating comparisons that cannot provide an increased yield of defect-free patterns on a substrate.

It is still another object of the invention to provide a method for determining the maximum yield of defect-free semiconductor devices that may be obtained in a mask matching process from the most difficult mask to fabricate of a plurality of mask levels used to make the semiconductor devices.

It is yet another object of the invention to provide a method for correlating the number of masks from the remaining levels that should be fabricated for use in a mask matching process to the number of the most difficult to fabricate mask that can be produced and the average number of random defects in the most difficult to fabricate mask.

These and other related objects may be obtained through use of the mask matching process herein disclosed. The invention is a process for preparing an array of pattern areas on a substrate. It uses a plurality of masks in successive steps to define parts of the pattern areas. The areas are subject to randomly-occurring defective patterns caused by random defects in the masks. The process requires the fabrication of a number of masks for a first one of the plurality of steps used to make the array. The first of the plurality of steps is preferably denoted as that step requiring the use of the most difficult to fabricate mask. The number of these masks produced is then determined by the difficulty in fabricating them. The average number of randomly occurring defects in the masks for this first step is then determined. If the defect locations in these masks are compared with the defect locations in masks for the other steps and the proper mask combination selected, a certain maximum number of defect-free pattern areas will be obtained. The next step in the process is to determine this maximum number of defect-free pattern areas that can be obtained. Alternatively, the number of defect-free patterns on the substrate desired may be specified, then enough of the first level masks to give this number fabricated.

In the fabrication of masks for a second one of the steps, usually a mask not as difficult to fabricate as the masks for the first step, a certain average number of defects will be obtained. Once the average number of defects in these masks for the second step is known, the number of masks needed for the second step to give at least the same number of defect-free pattern areas on the substrate array as with the masks for the first step is determined. This number of masks for the second step is then fabricated.

A combination of one mask from each of these levels may now be selected in a mask matching process. For this purpose, the location of defects or defect-free patterns in the masks is determined. The location of defects or defect-free patterns in the masks of the first and second steps is compared. A combination of a mask for each of the first and second steps to maximize the number of defect-free patterns in the array produced using these steps is selected. To complete the process, masking operations in the first and second steps to make the array of patterns on the substrate using the selected combination of masks are carried out.

In most integrated fabrication processes, more than two steps requiring the use of different masks are carried out. Therefore, the average number of defects obtained in the fabrication of masks for additional steps, such as a third, fourth, or fifth step is determined. The number of masks needed for each of these additional steps to give at least the same number of defect-free pattern areas on the substrate array as with the masks for the first step is determined. At least a sufficient number of the masks for these additional steps to give the same number of defect-free patterns as the masks of the first step is fabricated. The masks for these additional steps are then included in the defect matching operations to obtain a combination of one mask from each of the levels which maximizes the number of defect-free integrated circuits in the array produced.

The mask matching part of the process may be carried out using either the embodiment disclosed in the copending DePuy application or the copending Kuschel application. Therefore, one mask for each of the steps may be combined in all possible combinations and the best combination selected to maximize yield. Alternatively, the defect locations may be compared and the selection of a mask combination may be carried out by selecting a mask for one of the steps and comparing the location of defects in masks for the second step with the location of defects in the selected mask for the first step. A mask for the second step may then be selected to maximize the number of defect-free positions in the combination of first and second step masks. The location of defects in masks for a third step may then be compared with the location of defects in the combination of first and second step masks selected. A mask from those for the third step is then selected to maximize the number of defect-free positions that may be produced by the combination of first, second, and third step masks.

The present invention gives a simplified process with either mask matching method. The result is to give combination of masks for fabrication of high yields of an array of patterns on a substrate while fabricating a minimum total number of masks and making a minimum number of combinations before the high yield combination can be selected.

The foregoing and other objects, features, and advantages of the invention will be apparent from the following more particular description of the preferred embodiments of the invention, as illustrated in the accompanying drawings.

DESCRIPTION OF THE PREFERRED EMBODIMENT

Figure 1:
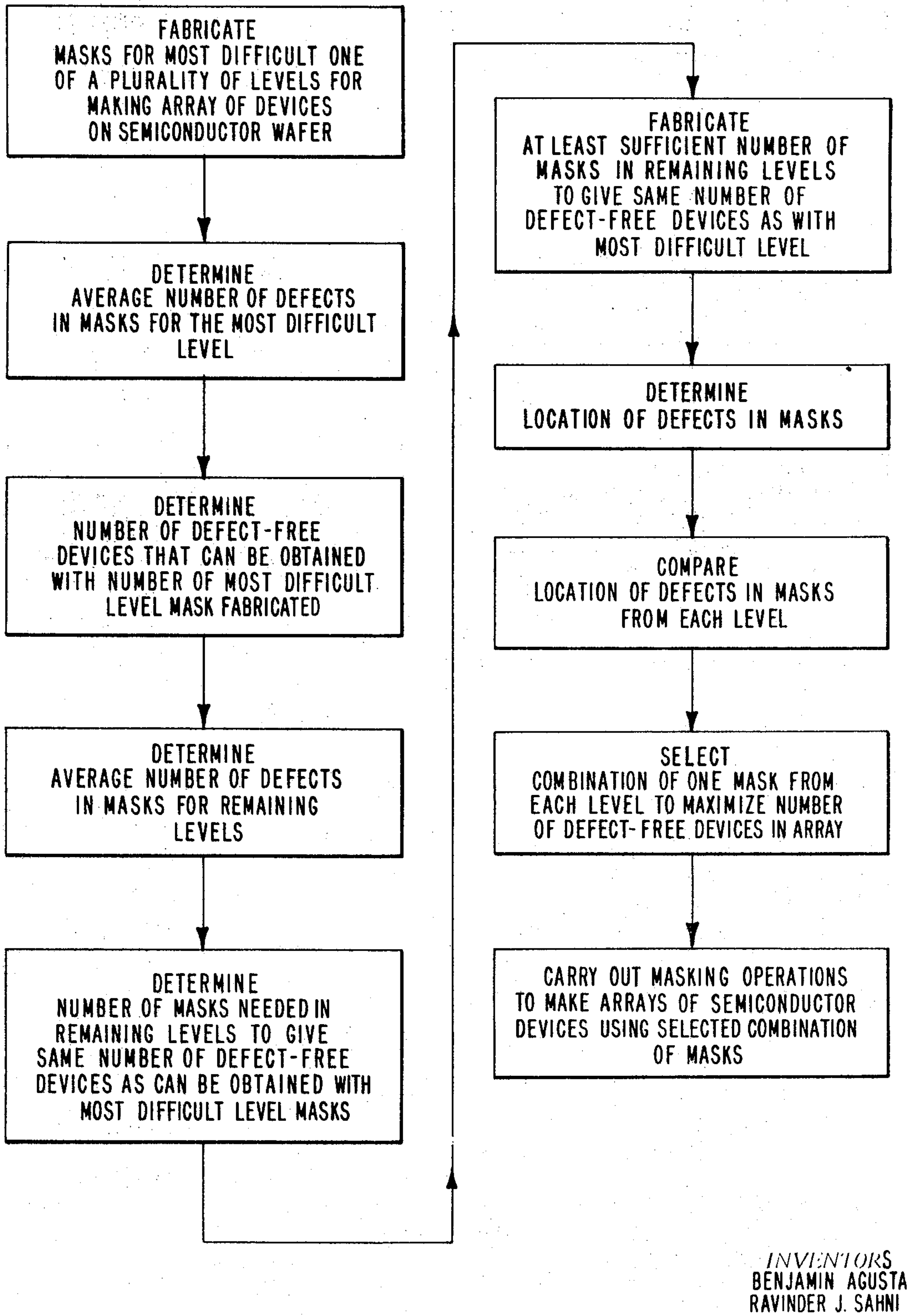
FIG. 1 is a flow diagram of the claimed process.

Referring now to the drawings, more particularly to FIG. 1, there is shown a flow diagram of a mask matching process in accordance with the invention, showing its basic steps. The first step in carrying out the process is to fabricate masks for the most difficult one of a plurality of levels of masks for making an array of devices on a semiconductor wafer. As an example of such a mask, reference is made to the above cited copending Agusta et al. application Ser. No. 539,210. That application shows only one pattern in the array of the mask concerned. The actual mask itself consists of an array containing a large number of the patterns shown.

As indicated in that application, the mask patterns shown are greatly enlarged. Fabrication of an array of these patterns in very small size e.g., about 0.06 inch by 0.06 inch each) is extremely difficult. In the fabrication of an array of such patterns, random defects occur which make the pattern defective where they occur. Consequently, semiconductor devices produced using the defective member of the array are themselves defective. The next step in the process is therefore to determine the average number of defects in the masks that have been fabricated for the most difficult mask to produce.

A sufficient number of these masks are fabricated to give a desired number of defect-free devices on the wafer. This may require an increase in fabrication capacity. Alternatively, the number of this mask which is produced is determined by the capacity to fabricate them. The number of defect-free devices that can be obtained with the number of the most difficult level mask fabricated is then determined.

The average number of defects in masks for the remaining mask levels is then determined. The number of each remaining mask level which must be fabricated may then be determined. The result is that the number of each remaining mask level is such as will produce the same number of defect-free devices on the semiconductor wafer as the most difficult to fabricate masks. To obtain a high-yield mask combination, the location of defects in the masks is determined and compared in masks from each level. A combination of one mask from each level may then be selected to maximize the number of defect-free devices in the array produced. This selected combination of masks is then used to carry out masking operations in the fabrication of an array of the devices.

Figure 2:
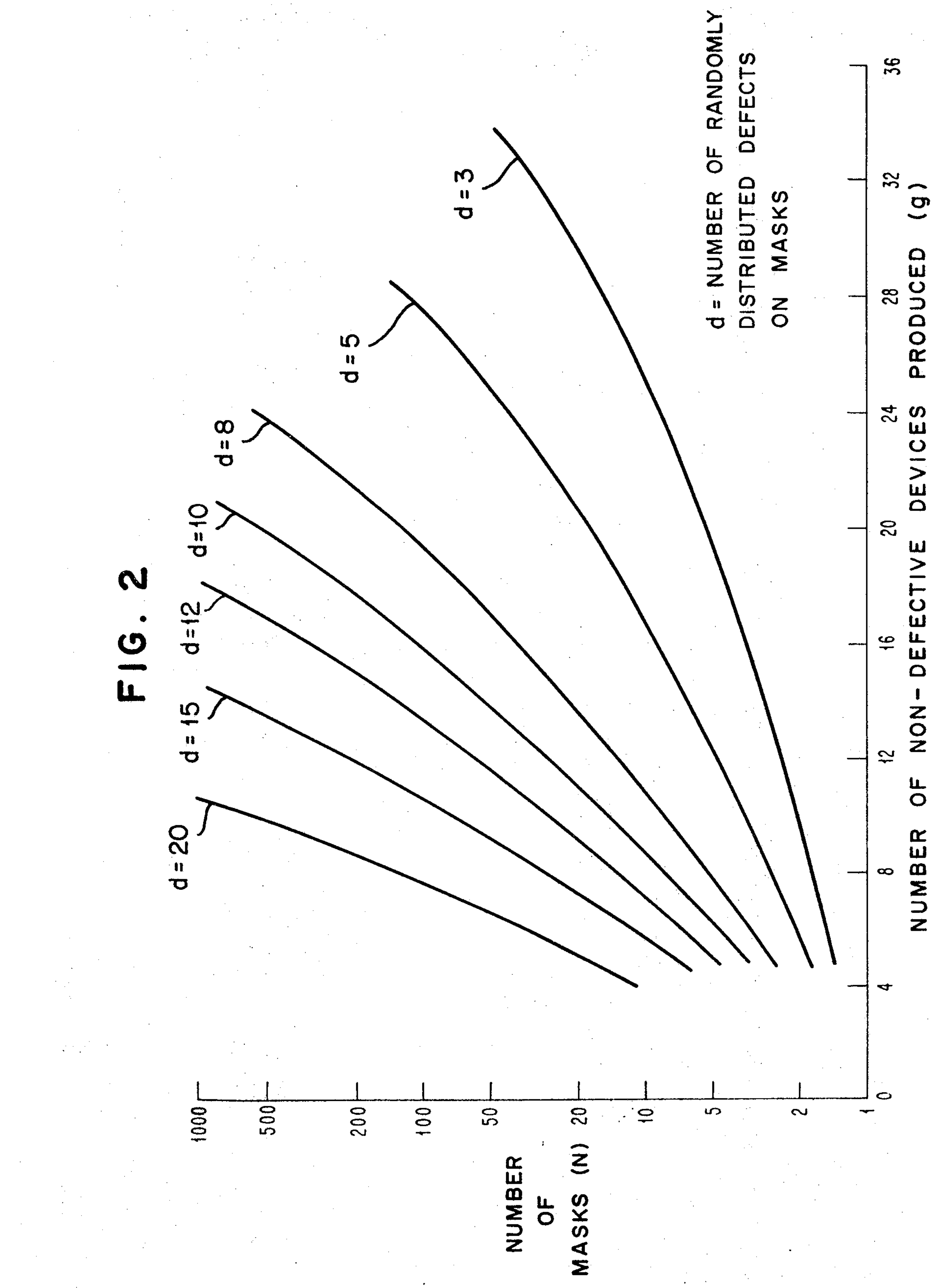
FIG. 2 is an example of a nomograph which may be used to carry out the claimed process.

FIG. 2 in the drawings is a nomograph which may be used to give the maximum number of defect-free chip locations that can be produced with a given number of masks for a certain level having a given average number of defects, if the masks are used in a mask matching process. This nomograph is for masks used to produce an array of 47 integrated circuits on a semiconductor wafer.

As an example, if 200 masks of a given level having an average of 10 random defects in the 47 positions are available, the nomograph shows that these masks would be capable of providing a total of 18 defect-free integrated circuits if they are matched with masks from the other levels.

This information may then be used to determine how many of the other level masks are needed to give as many nondefective integrated circuits. For example, if masks being produced for another one of the levels contain an average of eight random defects, only about 60 of these masks would be needed to give the same number of nondefective integrated circuits when matched with the masks containing 10 random defects. This means that if more than about 60 of the masks containing eight random defects are produced, they will not add any additional number of defect-free integrated circuits to the yield obtained.

The nomograph in FIG. 2 is a graph of the relationship:

$$N=\frac{Y!(Y-g-d)!}{(Y-d)!(Y-g)!}$$

in which $Y$ is the total number of integrated circuits in the array, and is equal to 47 in the case of the nomograph in FIG. 2, $g$ is the number of nondefective integrated circuit devices that can be produced in the array, if a mask matching process is used, which in the above example would be 18, $d$ is the average number of defects in the masks for a process step, and $N$ is the number of masks in the inventory at a particular mask level.

On the basis of the above formula, the number of defect-free integrated circuits that may be obtained with given mask inventories having a given number of average random defects has been found to be independent of the number of masking levels carried out in the integrated circuit manufacturing process. The derivation of the above formula is shown by the following example.

Assume an array of 47 semiconductor devices produced in a semiconductor manufacturing process involving a plurality of masking steps. Assume that the masks used to produce this array contain an average of six randomly occurring defects. Assume further that it is desired to produce a total of 24 nondefective integrated circuits in the process. This means that the six randomly occurring defects must be located in the remaining 23 positions of the array. Therefore, the probability that a first random defect lies on any one of these 23 locations equals 23/47. The probability that a second random defect occurs on any one of the remaining 22 locations on which the random defects may occur is 22/46. The probability that the third random defect lies on any one of the remaining 21 locations in which the defects may occur is 21/45. Continuing, the probability that the sixth bad chip lies on any one of the remaining 18 locations in which it may occur is 18/42. The total probability that the desired result indicated above will occur for any given mask is $$\frac{23\times 22\times 21\times 20\times 19\times 18}{47\times 46\times 45\times 44\times 43\times 42}$$

or 1/106. An equivalent form of the total probability, or $1/N$ is the relationship:

$$\frac{\frac{23!}{17!}}{\frac{47!}{41!}}$$

23 is equal to $47-g$;

23 is equal to $47-g-d$; and 41 is equal to $47-d$, where $g$ and $d$ have the significance given previously.

These substitutions may be made in the last relationship to give the following:

$$\frac{\frac{(47-g)!}{(47-g-d)!}}{\frac{47!}{(47-d)!}}$$

Rearranging, the following equation for total probability is obtained:

$$\frac{1}{N}=\frac{(47-g)!(47-d)!}{47!(47-g-d)!}$$

In our case, $1/N=1/106$.

Since total probability means that the chances are one out of, in this example, 106 that a particular mask chosen from a mask level will provide the match of defects with other masks to give the results desired, this means that 106 masks are needed to insure that one mask may be found at the level concerned to give the required defect match. Expressing the last equation in terms of the number of masks required, rather than total probability, gives:

$$N=\frac{47!(47-g-d)!}{(47-g)!(47-d)!}$$

This relationship may be generalized for arrays containing other than 47 integrated circuits as originally set forth:

$$N=\frac{Y!(Y-g-d)!}{(Y-g)!(Y-d)!}$$

This is the general relationship which may be used to carry out the process of the invention.

In FIG. 2, the relationship has been graphed for various numbers of random defects occurring in masks, for an array of 47 integrated circuit devices on a wafer, as indicated.

The above formula is used at two places in the process as described above. First, it is used to determine the number of good integrated circuits that may be produced with the number of the most difficult mask to fabricate that can be produced and the random defect level for that most difficult mask. Second, the formula is used to determine how many of the other masks need to be produced to give the same number of defect-free integrated circuits in the array if mask matching is employed. Alternatively, the formula is used to determine how many of each level masks must be produced to give a certain yield of defect-free devices on a semiconductor wafer.

Once the masks for the different levels have been obtained with the assistance of the above formula, these masks may be matched in accordance with either the copending DePuy application or the Kuschel application. The actual matching may be carried out through the use of clear plastic cards with the defect locations for the masks indicated on them or, alternatively, through use of a suitably programmed computer having the defect locations for the masks stored in its memory. For details on carrying out mask matching by either of these approaches, reference is made to those applications.

USE OF SELECTED MASKS

Figure 3:
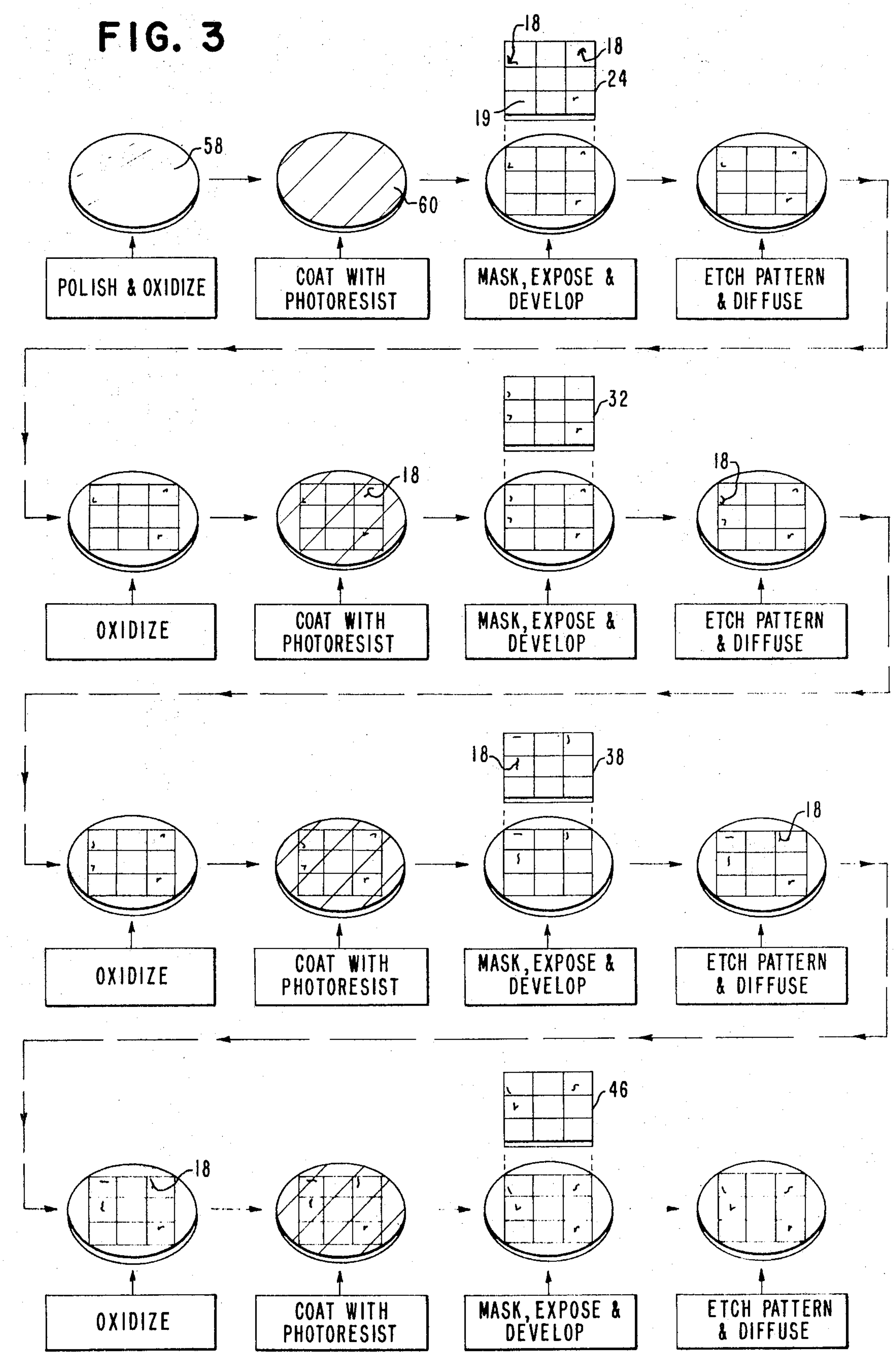
FIG. 3 shows the use of a combination of masks selected in accordance with the invention to produce an array of semiconductor devices on a wafer.

FIG. 3 shows how the masks selected by either embodiment of the mask matching process in the practice of the invention are used to make semiconductor devices on a wafer 58 of silicon or other semiconductor material. The wafer is first polished to a smooth surface and then oxidized. The oxidized wafer 58 is then coated with a layer of photoresist 60. An A level mask 24 containing a first pattern desired to be reproduced in the photoresist 60 is aligned on the surface of the photoresist coated wafer. The photoresist is exposed to suitable light through the mask, then the photoresist is developed to remove either the exposed or unexposed areas, depending on whether a negative or positive photoresist is used. An etching operation is then carried out on the wafer 58. The photoresist 60 remaining on the surface of the wafer after the developing step prevents etching from taking place on the areas of the wafer covered by it. Defects 18 in the mask 24, as well as the desired pattern, as contained in defect-free locations 19 are reproduced in the photoresist 60.

The etching operation removes the oxide layer from the wafer 58 in the areas not covered by photoresist 60 to expose elemental silicon. An impurity, such as boron, arsenic or phosphorus, may now be diffused into the elemental silicon to change its electrical conductivity characteristics.

As shown in FIG. 3, the oxidation, photoresist coating, masking, exposing, developing, etching, and diffusion steps are repeated utilizing B mask 32, C mask 38, and D mask 46 to produce desired effects in the wafer 58. In addition to or alternatives to the four diffusion steps shown in FIG. 3, other processing operations on the elemental silicon exposed by the etching process may be carried out, such as epitaxial growth of silicon. Also, masks selected in accordance with the invention may be used to produce other types of patterns on the semiconductor wafer, such as aluminum conducting lines joining individual monolithic components in the circuits being produced. For further details on such monolithic integrated structure fabrication processes, reference is made to the above mentioned copending Agusta et al. application.

It should now be apparent that an optimized process for producing integrated circuits on a semiconductor wafer or other patterns on a substrate utilizing mask matching and capable of carrying out the stated objects of the invention has been provided. The process enables the number of masks from different levels that should be fabricated for use in a mask matching process for making an array of patterns on a substrate to be determined. This enables the production of additional masks which would not increase the yield of defect-free integrated circuit devices to be eliminated. The result is that additional needless comparisons of masks from the different levels are avoided.

While the invention has been particularly shown and described with reference to preferred embodiments thereof, it will be understood by those skilled in the art that various changes in form and details may be made therein without departing from the spirit and scope of the invention.

What is claimed is:

1. A process for the manufacture of an array of integrated circuits on a semiconductor wafer using masks to define areas of each circuit in a plurality of successive process steps, comprising:

a. determining the average number of defects in the masks for each process step,
b. establishing a first number of masks for one of the process steps,
c. determining the number of good integrated circuits in the array that can be obtained with the first number of masks, the number corresponding substantially to that which may be obtained with the relationship:

$$N=\frac{Y!(Y-g-d)!}{(Y-d)!(Y-g)!}$$

wherein: $Y$ is the total number of integrated circuits
$g$ is the number of defect-free integrated circuits in the array that can be obtained if mask matching is carried out,
$d$ is the average number of defects in the masks for the process step, and
$N$ is the number of masks in the first inventory of masks, d. establishing a second inventory of masks for another one of the process steps sufficient to give at least the same number of good integrated circuits in the array as the first inventory of masks, the number of masks in the inventory corresponding substantially to that which may be obtained with the above relationship,
e. inspecting the masks in the inventories so established to determine the location of defects thereon,
f. recording the location of the mask defects,
g. comparing the location of the mask defects in masks for the plurality of process steps,
h. selecting a particular combination of one mask for each of the plurality of successive process steps which will minimize the number of defective integrated circuits in the array, and
i. carrying out the successive process steps, using one mask from the selected combination for each successive process step, to define a part of each integrated circuit in a light-responsive pattern defining medium.

2. The process of claim 1 in which the comparison of defect locations and selection of a mask combination is made by:

a. selecting a mask from those for a first one of the steps,
b. thereafter comparing the location of defects in masks from those for a second one of the steps with the location of defects in the mask for the first step selected,
c. then selecting a mask from those for the second step to maximize the number of defect-free positions in the combination of first and second step masks,
d. thereafter comparing the location of defects in masks from those for a third step with the location of defects in the combination of first and second step masks selected, and
e. then selecting a mask from those for the third step to maximize the number of defect-free positions in the combination of first, second, and third step masks.

3. The process of claim 2 in which the light-responsive pattern defining medium is photoresist.

4. A process for the manufacture of an array of integrated circuits on a semiconductor wafer using masks to define areas of each circuit in a plurality of successive process steps, comprising:

a. determining the average number of defects in the masks for each process step, b. establishing a first number of masks for one of the process steps, c. determining the number of good integrated circuits in the array that can be obtained with the first number of masks, on the basis of the relationship:

$$N=\frac{Y!(Y-g-d)!}{(Y-d)!(Y-g)!}$$

wherein: $Y$ is the total number of integrated circuits in the array, $g$ is the number of defect-free integrated circuits in the array that can be obtained if mask matching is carried out, $d$ is the average number of defects in the masks for the process step, and $N$ is the number of masks in the first inventory of masks, d. establishing a second inventory of masks for another one of the process steps sufficient to give at least the same number of good integrated circuits in the array as the first inventory of masks, on the basis of the above relationship, e. inspecting the masks in the inventories so established to determine the location of defects thereon, f. recording the location of the mask defects, g. comparing the location of the mask defects in masks for the plurality of process steps, h. selecting a particular combination of one mask for each of the plurality of successive process steps which will minimize the number of defective integrated circuits in the array, and i. carrying out the successive process steps, using one mask from the selected combination for each successive process step, to define a part of each integrated circuit in a light-responsive pattern defining medium.

5. The process of claim 4 in which the comparison of defect locations and selection of a mask combination is made by:

a. selecting a mask from those for a first one of the steps, b. thereafter comparing the location of defects in masks from those for a second one of the steps with the location of defects in the mask for the first step selected, c. then selecting a mask from those for the second step to maximize the number of defect-free positions in the combination of first and second step masks, d. thereafter comparing the location of defects in masks from those for a third step with the location of defects in the combination of first and second step masks selected, and e. then selecting a mask from those for the third step to maximize the number of defect-free positions in the combination of first, second, and third step masks.

6. The process of claim 4 in which the light-responsive pattern defining medium is photoresist.

7. A process for preparing an array of monolithic integrated circuits on a semiconductor wafer, using a plurality of masks in levels for successive processing steps to define parts of the integrated circuits, the integrated circuits being subject to randomly occurring defects caused by random defects in the masks, comprising:

a. fabricating a number of masks for each level, b. determining the average number of randomly-occurring defects in the masks for each level, c. determining the number of masks for each level required to give a certain number of defect-free circuits on the wafer if mask matching is carried out, the number corresponding substantially to that which may be obtained with the relationship:

$$N=\frac{Y!(Y-g-d)!}{(Y-d)!(Y-g)!}$$

wherein: $Y$ is the total number of integrated circuits in the array, $g$ is the number of defect-free integrated circuits in the array that can be obtained if mask matching is carried out, $d$ is the average number of defects in the masks for the process step, and $N$ is the number of masks required for a level, d. adjusting the number of masks available for each level to give at least the number of defect-free circuits in step c) for each level, e. determining the location of defects in the masks, f. comparing the location of the defect-free pattern areas in the masks, g. selecting a combination of one mask from each level to maximize the number of defect-free circuits produced on the wafer, h. coating the semiconductor wafer with a photoresist, i. using a first mask from the selected combination to expose the photoresist, j. carrying out the remainder of a first processing step on the semiconductor wafer, k. coating the semiconductor wafer with photoresist a second time, l. using a second mask from the selected combination to expose the photoresist, m. carrying out the remainder of a second processing step on the semiconductor wafer, and n. continuing the plurality of processing steps on the semiconductor wafer using the remaining masks from the selected combination to expose photoresist on the semiconductor wafer.

PO-1050
(5/69)

UNITED STATES PATENT OFFICE
CERTIFICATE OF CORRECTION

Patent No. 3,615,464 Dated October 26, 1971

Inventor(s) Benjamin Agusta and Ravinder J. Sahni

It is certified that error appears in the above-identified patent and that said Letters Patent are hereby corrected as shown below:

Column 8, Line 35, after "circuits" add -- in the array --.

Signed and sealed this 1st day of August 1972.

(SEAL)
Attest:

EDWARD M.FLETCHER,JR.
Attesting Officer

ROBERT GOTTSCHALK
Commissioner of Patents